United States Patent
Ma et al.

(10) Patent No.: US 7,054,599 B2
(45) Date of Patent: May 30, 2006

(54) HIGH DENSITY INTERCONNECT STRUCTURE FOR USE ON SOFTWARE DEFINED RADIO

(75) Inventors: Kelvin Ma, Clifton Park, NY (US); Richard Louis Frey, Delanson, NY (US); Michael Joseph Mahony, Niskayuna, NY (US); John Jesse Soderberg, Acworth, GA (US)

(73) Assignee: Lockheed Martin Corporation, Bethesda, MD (US)

( * ) Notice: Subject to any disclaimer, the term of this patent is extended or adjusted under 35 U.S.C. 154(b) by 553 days.

(21) Appl. No.: 10/434,053

(22) Filed: May 8, 2003

(65) Prior Publication Data

US 2004/0224647 A1   Nov. 11, 2004

(51) Int. Cl.
*H04B 1/38* (2006.01)

(52) U.S. Cl. .............. 455/128; 455/550.1; 455/552.1; 455/553.1; 361/748

(58) Field of Classification Search .............. 455/128, 455/550.1, 552.1, 553.1, 95, 103, 575.1; 361/748, 728, 736, 752
See application file for complete search history.

(56) References Cited

U.S. PATENT DOCUMENTS

| 4,437,718 | A | * | 3/1984 | Selinko | 439/591 |
|---|---|---|---|---|---|
| 4,730,232 | A | * | 3/1988 | Lindberg | 361/688 |
| 4,910,643 | A | * | 3/1990 | Williams | 361/793 |
| 5,033,977 | A | * | 7/1991 | Ignasiak | 439/482 |
| 6,388,205 | B1 | * | 5/2002 | Chua | 174/261 |
| 6,421,225 | B1 | * | 7/2002 | Bergstedt | 361/313 |
| 2002/0195610 | A1 | * | 12/2002 | Klosowiak | 257/98 |
| 2003/0015720 | A1 | * | 1/2003 | Lian et al. | 257/98 |
| 2003/0156402 | A1 | * | 8/2003 | Ding et al. | 361/820 |
| 2004/0042190 | A1 | * | 3/2004 | Eng et al. | 361/795 |

* cited by examiner

*Primary Examiner*—Doris H. To
*Assistant Examiner*—Minh Dao
(74) *Attorney, Agent, or Firm*—Scully, Scott, Murphy & Presser, P.C.

(57) ABSTRACT

A radio and method of making the radio is disclosed having a first set of radio components for processing analog signals in a radio transmission and a second set of radio components for processing digital signals in a radio transmission. The radio comprises a substrate base support, and at least one pocket formed within the substrate. The radio comprises at least one processor, each of the at least one processor being within a corresponding one of the at least one pocket for modulating a radio signal into one of a plurality of waveforms based on a software instruction set. Each of the at least one processor being in electronic communication with both of the first and second sets of the radio components. A dielectric layer covers a top surface of the substrate and each of the at least one processor. A plurality of vias are formed in the dielectric layer to expose selected portions of each of the at least one processor. A metallization layer is formed over the dielectric layer and over the plurality of vias so that each of the at least one processor is in electrical communication with the first and second sets of radio components.

38 Claims, 5 Drawing Sheets

HIGH DENSITY INTERCONNECT STRUCTURE FOR USE ON SOFTWARE DEFINED RADIO

FIELD OF THE INVENTION

This invention relates in general to the field of wireless communications, and in particular to the packaging of software-defined radio.

BACKGROUND

Software defined radio has the flexibility to send and receive radio signals over a wide spectrum of frequencies and over a wide bandwidth simply by altering the software in the system. Software defined radio allows a single system to communicate with virtually any other system. Accordingly, software defined radio has applications in consumer cellular phones communicating in and between different countries and applications in many military communication systems.

To accommodate the high performance, high-speed digital requirements of software defined radio, the analog portion of software defined radio has complicated tunable filters, amplifiers and preamplifiers. The conventional packaging of these analog components on a circuit board imposes a difficult hardware-packaging problem. The conventional packaging technology, using conventional printed circuit boards produces a physically large and heavy system having thermal issues that are difficult to manage. These complications limit the application of software defined radio and make portable software defined radios impractical for everyday consumer use and for aircraft and other military equipment.

Other problems associated with conventional packaging techniques of a software defined radio include the long interconnect traces between the many active and passive discrete components on the circuit board. These interconnects introduce unwanted noise into the software defined radio which further complicate otherwise taxed filtering systems integrated into the software defined radio. These interconnects also introduce parasitic trace and soldering interferences. These parasitic interferences further distort the transferred or received signal and decrease the affectability of the software defined radio.

SUMMARY OF THE INVENTION

According to the above objects, there is provided a software defined radio built on a high density interconnect structure having a first set of radio components for processing analog signals in a radio transmission and a second set of radio components for processing digital signals in a radio transmission. In one embodiment, the radio comprises a substrate base support, and at least one pocket formed within the substrate. The radio comprises at least one processor, each of the at least one processor being within a corresponding one of the at least one pocket for modulating a radio signal into one of a plurality of waveforms based on a software instruction set. Each of the at least one processor being in electronic communication with both of the first and second sets of the radio components. A dielectric layer covers a top surface of the substrate and each of the at least one processor. A plurality of vias are formed in the dielectric layer to expose selected portions of each of the at least one processor. A metallization layer is formed over the dielectric layer and over the plurality of vias so that each of the at least one processor is in electrical communication with the first and second sets of radio components.

The radio according to the invention is a software defined radio built upon a high density interconnect structure so that the size of the software defined radio can be substantially reduced to the point where a portable system is practical for everyday consumer use and for aircraft and other military equipment.

The radio according to the invention is a software defined radio build upon a high density interconnect structure so that heat is effectively removed from the circuitry.

The radio according to the invention is a software defined radio built upon a high density interconnect structure so that the radio conforms to the design criterion by reducing the undesired parasitic effects caused by lead lengths of standard parts requiring standard interconnects.

BRIEF DESCRIPTION OF THE DRAWINGS

The accompanying drawings serve to illustrate the embodiments of the invention disclosed herein, in which.

DESCRIPTION OF THE EMBODIMENTS

The invention will be better understood from reading of the following detailed description in conjunction with the drawings in which like reference designators indicate like elements in the various drawing figures.

Figure 1:
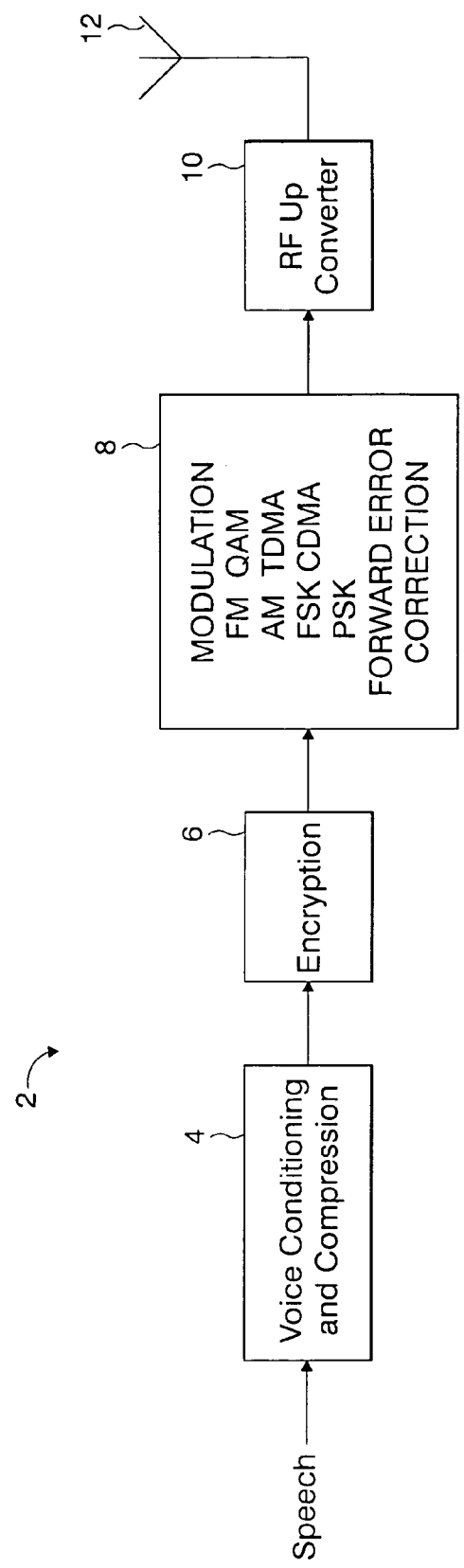
FIG. 1 is a diagram illustrating the functional aspects of the various elements of the software defined radio of the present invention.

Turning to FIG. 1, a transmitter 2 of a software defined radio according to the invention conditions and compresses 4, and encrypts 6 an analog voice signal. The transmitter 2 then modulates 8 the signal into any of a plurality of modulation types known in the art, including frequency modulation (fm), amplitude modulation (am), frequency shift keying (fsk), phase shift keyed, (psk) quadrature amplitude modulation (qam), time division multiplexing (tdma), code division multiplexing (cdma) and other modulation functions known in the art.

After modulation 8, the transmitter 2 subjects the signal to a radio frequency (rf) up-conversion 10, which includes converting the signal from digital to analog. The up-conversion 10 is analog in nature. The up-conversion 10 utilizes the baseband modulation output of the modulation 8 and converts the baseband modulation to an rf carrier. The modulated rf carrier is applied to antenna 12.

Figure 2:
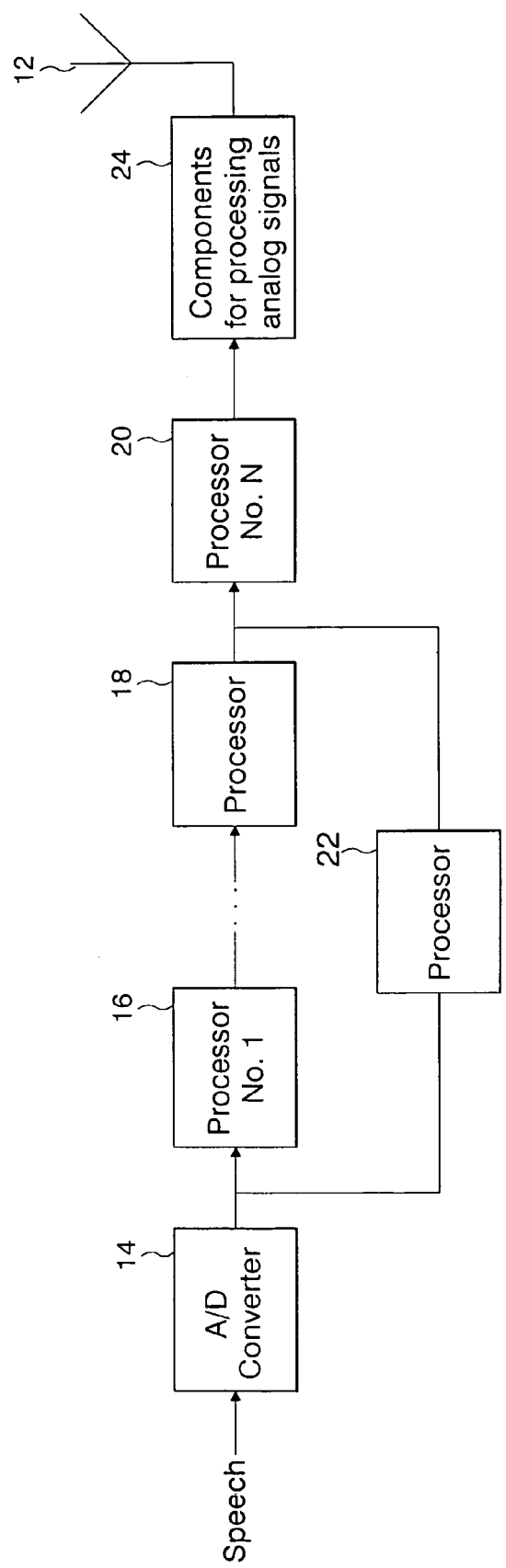
FIG. 2 is a block diagram of a software defined radio of the present invention.

FIG. 2 is a block diagram of the components of the transmitter 2 that perform the operations of FIG. 1. Speech is applied to an analog to digital converter or digitizer 14 to produce digital information. The output of digitizer 14 is a digital data stream that enters one or more microprocessor blocks 16–22. The processing of digital information by processors 16–22 is performed in software, known in the art, which can be selected and changed dynamically. Processors 16–22 have memory (not shown) such as ROM for storing the differing types of waveforms and cache for recalling and rapidly switching between types of waveforms. Memory also includes flash memory so that the last waveform used by the radio prior to powering down is instantly loaded at the next power up, allowing for substantially instantaneous use.

Any number of separate processors from 1 to N, may be disposed between processors 16–22. For example, one processor performs the operation of voice conditioning and compression 16, one processor performs the operation of encryption 18 and one processor performs the operation of modulation 18. The one or more processors includes a controller 22 coupled to a user interface (not shown). The processor 22 is a controller which controls the compression, encryption and modulation of a signal, so that a user can dynamically select the appropriate waveform of the transmitted signal. For example, the user may be required to alternatively communicate over a military communication system and a civilian communication system, each having a differing modulation requirement, known in the art. It will be appreciated that although separate processors 16–22 are illustrated, multifunction processors exist that can replace a plurality of processors 16–22.

The output of processors 16–22 passes through components 24 that perform radio frequency (rf) up-conversion, including converting the signal from digital to analog and passing the signal through antenna 12. Components 24 are analog in nature, are well known in the art, and therefore, further detail related to these devices will be omitted.

It will be appreciated by one skilled in the art that the transmitter 2 comprises components that are readily usable as a signal receiver. Incoming analog signals are converted to digital pulses through a device that performs rf down conversion. These incoming signals are fed to one or more processors 16–22 for determining the type of waveform of the received signal, demodulating the waveform according to type of waveform detected, decrypting the received signal, and decompressing the signal, where each step is performed in a manner known in the art.

When the system acts as a receiver, the controller 22 determines an appropriate sampling rate for the waveform. The controller 22 controls acquisition parameters and age requirements so that the system may receive and process the signal. Such parameters include, for example, loop bandwidth and track and hold characteristics. Following decryption and decompression, analog to digital converter 14 converts the output of these signals into an analog speech signal, which is then output by a speaker (not shown).

Figure 3:
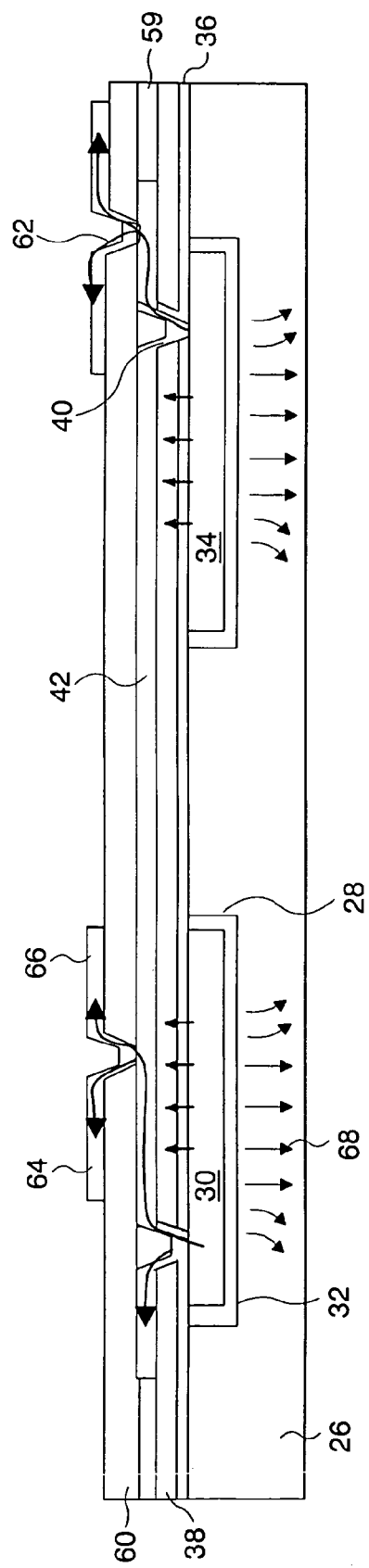
FIG. 3 is a sectional view of a packaging of the software defined radio of the present invention.

Turning to FIG. 3, according to the invention, there is disclosed a built-up structure of the components of the software defined radio using a high density interconnect structure. The high density interconnect structure of the software defined radio includes a ceramic substrate 26 that forms the base support of the high density interconnect. The substrate 26 may be manufactured from beryllium oxide (BeO), aluminum nitride (AlN), aluminum oxide ($AL_2O_3$), or another ceramic substrate having a predetermined thickness.

Pockets 28 are formed in the substrate 26 of the software defined radio. The pockets 28 are formed by milling, die casting, or other techniques known in the art that remove a portion of the substrate 26. Each pocket 28 is sized to be slightly larger than elements disposed therein, comprising a semiconductor die 30 and an adhesive 32 for securing the die. The thickness of each pocket 28, and adhesive layer 32, are such that the upper surface of the semiconductor die 30 will be co-planar with the upper surface of the substrate 26. By forming pockets 28 at this stage, complex and expensive milling or etching procedures can be eliminated.

Each semiconductor die 30 is laminated to the substrate 26 in a conventional lamination process that provides the adhesive layer 32 having a predetermined thickness. For example, the adhesive layer 32 is formed of the same material as the substrate 26 with the exception that it is in an uncured state. As an illustration, if the substrate 26 were formed with a polyimide material, then the adhesive 32 would be a polyimide adhesive. This lamination procedure is performed at a predetermined pressure and temperature. This lamination procedure maintains a stationary position for each active and passive component during subsequent process steps.

In the software defined radio according to the invention, each semiconductor die 30 disposed in each pocket 28 is either a passive component 34 or an active component 30. Each passive component 34 is, for example, an integrated inductor, an integrated capacitor, an integrated resister, or any multiple or combination of these components known in the art. The active components 30 of the software defined radio include, for example, a semiconductor device such as a MOSFET or an IGBT. According to the invention, the active components 30 include one or more processors 16–22 (FIG. 2) for performing compression/decompression, encryption/decryption, modulation, and system controlling functions.

A laminate coating 36 covers the top of each die 30, each component 34 and the substrate 26. A flexible polymer layer 38 is attached to the top of laminate 36. The lamination process for this layer includes treating the layer to promote adhesion by Reactive Ion Etching (RIE) and then coating the layer with a thermoset adhesive such as Siloxide Polymide epoxy. This lamination procedure maintains a stationary position for the layer 38 during subsequent processing. The polymer layer 38 is a dielectric film, which may be Kapton™ polyimide, available from E.I. du Pont de Neumors Company, having a predetermined thickness. Alternatively, polymer layer 38 is formed via spin-on processing, using a liquid polymer in a manner known in the art.

Vias 40 are formed through the polymer layer 38 to expose selected portions of IO pads on the upper surface of each active die 30 and passive component 34. Other portions of the polymer layer 38 are retained. Typically, the vias within the polymer layer 38 are formed by chemical or plasma etching or by laser drilling in alignment with the selected areas of each die 30 or component 34 underneath the polymer layer 38. There are a number of known techniques to perform this laser drilling. A pulsed laser could be utilized to generate openings in the polymer layer 38 or, alternatively, a scanning laser beam could be utilized. With the pulse laser, the openings in the polymer layer 38 are made by a single step ablation of an opening through the polymer layer 38. Once this step is completed, the appropriate vias 40 will be formed through the polymer layer 38, which will permit electrical connections to be made to the underlying exposed die for each component of the software defined radio.

Metallization 42 is deposited on the polymer surfaces after the vias 40 are formed. Metallization 42 is provided by first sputtering a conformal metal layer, for example, of titanium/copper to a predetermined thickness. A layer of copper is then electroplated onto the titanium/copper layer to a predetermined thickness. Thereafter, the surface of this layer is patterned by spraying, laminating or plating on a coating of photoresist and drying this layer for a predetermined amount of time at a predetermined temperature. Subsequently, the photoresist layer is exposed with a conventional imaging tool, such as a scanned laser.

After exposing the photoresist layer, the desired metallization pattern 42 is created through a photolithograph process with the photoresist. The pattern is then etched using an appropriate etching process to define interconnects through the vias 40 in the polymer layer 38, or through another pattern exposure process, known in the art.

Figure 4C:
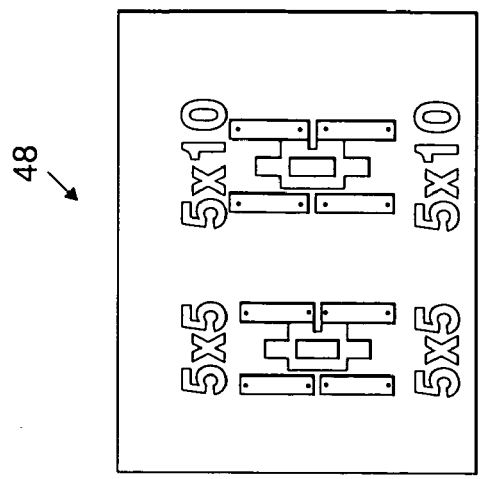
FIGS. 4–5 are top and sectional views of packaging of the software defined radio of the present invention.
Figure 4B:
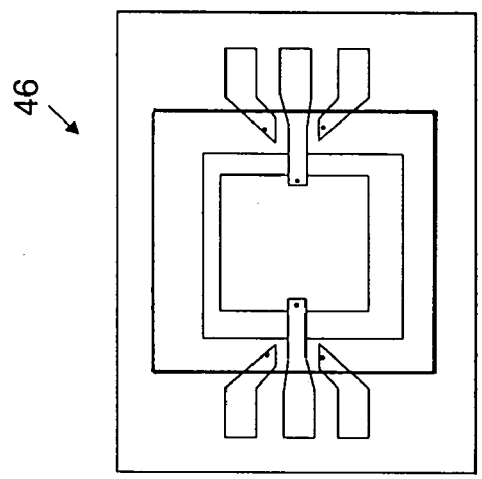
Figure 4A:
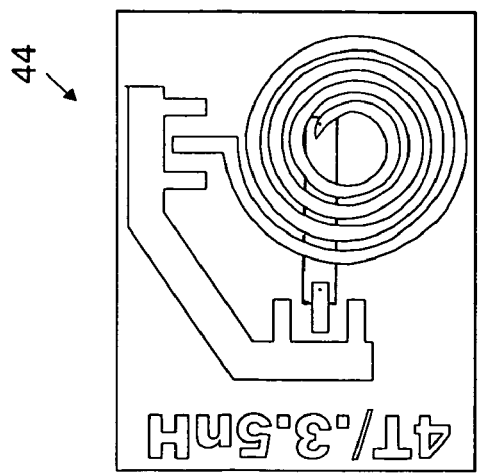
Figure 5:
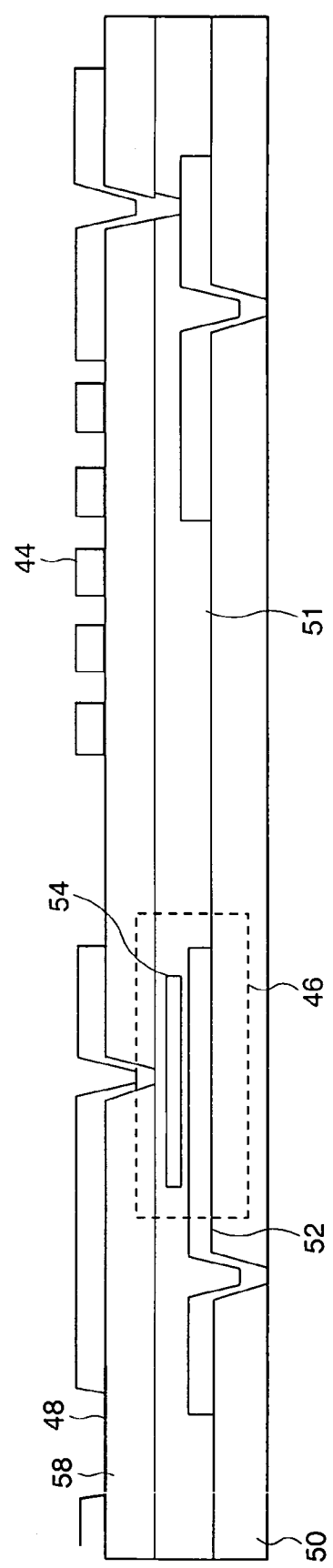

Turning to FIGS. 4–5, there is disclosed passive components 44–48 used in the high density interconnect structure of the present invention that are alternative to or in additional to the passive components 34 disclosed above. Passive components 44–48 are built directly on top of the interconnect structure. Such integrated structures include, for example, an integrated inductor 44, an integrated capacitor 46, and an integrated resistor 48.

An integrated inductor 44 is patterned as circular, squared or multi-sided polygon spirals on the metallized polymer surface 50. An integrated capacitor 46 is fabricated by using a layer of polymer film as the dielectric layer 51 (i.e., the adhesive), disclosed above, between two patterned metallized surfaces 52, 54 of adjacent interconnect layers. The size of these integrated capacitors 46 is reduced, for example, by introducing a thin, high dielectric layer 54 between polymer layers 50, 58 joined by adhesive 51. The layer consists of, for example, tantalum oxide, $Ta_2O_5$, or diamond like carbon, DLC. An integrated resistor 48 is formed, for example, by sputtering a highly resistive material 48 such as tantalum nitride, TaN or such materials as $Ti_2N$, $W_2N$, AlN, TaAl, TaTi, TaSi, or polysilicon, having a predetermined thickness. The layer of resistor material is patterned using, for example, photolithographic processing that requires a mask and a mask exposure step, forming a photoresist mask over the resistor. Alternatively, materials used to form in integrated inductor, capacitor or resister include conductive micro-strips, dielectric resonating structures, or planar resonating structures, in a manner known in the art.

Using integrated passive components for building lumped filters on the circuit has many benefits over the discrete component counterpart. If the lithographic build-up process is consistent, the variation in the performance characteristics between components will be small, and the overall yield for the system will be great. Also, this process saves time as compared to using discrete passive components because the filters are completed at the same time as the interconnect build-up. Parasitic noise and distortion can be reduced because the passive components are built physically closer to the active circuits as compared to discrete passive filters, thereby reducing unwanted noise from the system.

The above process is repeated, as required, until the necessary level of interconnect-layers is achieved in the software defined radio so as to achieve the requisite interconnect structure between the components. Specifically, a layer of laminate 59 is placed on top of polymer layer 38 and photoresist layer 42 (FIG. 3). An additional dielectric layer 60 (FIG. 3) is laminated on top of the above described photoresist layer 42. Vias 62 are formed in the new dielectric layer 60 and an additional metallization layer 64 is laminated thereto. A new photoresist layer is applied to the metallization layer 64, upon which a desired pattern is formed. The desired pattern includes covering vias 62 and producing integrated passive components. After the highest level of interconnect structure is formed, a layer of solder mask (not shown), for example, is deposited on the surface to provide a protective covering and function as a passivation layer. Alternatively, another layer of polymer is laminated to the structure. Yet alternatively, a further substrate is manufactured having a further set of active and passive die, and vias having the appropriate metallization (not shown). This substrate is flipped and connected to the top dielectric layer 60. Accordingly a flip-chip style processor, otherwise known in the art, is formed using high density interconnect structure.

In another embodiment, the base structure 26 is formed with a conductive material, such as a metal frame (not shown). A polymer flexible layer is stretched to cover the metal frame, in a manner known in the art. An adhesive layer is applied to the polymer layer, similarly to the adhesive layer 32, above. Active and passive discrete components are mounted to the adhesive layer so that connection pads are facing towards the polymer layer. A liquid polymer is injected or flowed to completely encapsulate the components on the frame. The polymer contains ceramic particles (not shown) for providing beneficial electrical and thermal characteristics, known in the art. Vias 40 are formed on top of this plastic, as disclosed above, to expose IO pads on the upper surfaces of the active and passive components. Metal shims (not shown) are placed upon the components for integrating heat sinks (not shown) into the system. The heat sinks provide beneficial thermal characteristics, known in the art. The remainder of the high density interconnect structure of the software defined radio is equivalent to that disclosed above.

In use, there is provided a software defined radio, built upon a high density interconnect structure. As disclosed above, the high density interconnect structure allows active and passive discrete components to connect through a series of vias, rather than though long trace interconnects that are common in the art. The connection is illustrated by arrows 66 in FIG. 3. Further, the built-up structure of the high density interconnect structure has a substantially reduced size so that a hand portable software defined radio may be realized.

When a software defined radio built upon a high density interconnect is operated, the substantially reduced connectivity, as compared to the long connector traces of conventional printed circuit boards, greatly diminishes the heat generated by and between the radio components. This diminished heat is more easily distributed through semiconductor substrate 26 as demonstrated by arrows 68, in FIG. 3. This heat reduction enables making smaller, more practical equipment for aircraft and other mobile equipment. Further, the reduction of the component leads in the high density interconnect structure reduces parasitic effects during the operation of the software defined radio. The reduced parasitic effects provide a software defined radio that operates more according to design parameters, having reduced distortion and noise in the system.

While the invention has been particularly shown and described with reference to the preferred embodiments thereof, it will be understood by those skilled in the art that various changes in form and details may be made without departing from the spirit and scope of the invention.

What is claimed is:

1. A radio having a first set of radio components for processing analog signals in a radio transmission and a second set of radio components for processing digital signals in a radio transmission, the radio comprising:

a substrate base support;

at least one pocket formed within the substrate;

at least one processor, each of the at least one processor being within a corresponding one of the at least one pocket for modulating a radio signal into one of a plurality of waveforms based on a software instruction set, each of the at least one processor being in electronic communication with both of the first and second sets of the radio components;

a dielectric layer covering a top surface of the substrate and each of the at least one processor;

a plurality of vias formed in the dielectric layer to expose selected portions of each of the at least one processor; and a metallization layer formed over the dielectric layer and over the plurality of vias so that each of the at least one processor is in electrical communication with the first and second sets of radio components.

2. The radio of claim 1, wherein at least one of the at least one processor determines the type of waveform modulation to be performed, performs voice encryption and decryption, and compression and decompression of a digital signal.

3. The radio of claim 1, wherein the at least one processor includes a first processor for determining the type of waveform modulation and a second processor for performing voice encryption and decryption.

4. The radio of claim 3, wherein the at least one processor includes a third processor for performing voice compression and decompression.

5. The radio of claim 3, wherein the plurality of waveforms includes two or more of frequency modulation (fm), amplitude modulation (am), frequency shift keying (fsk), phase shift keyed, (psk) quadrature amplitude modulation (qam), time division multiplexing (tdma), and code division multiplexing (cdma).

6. The radio of claim 1 wherein the plurality of waveforms includes two or more of frequency modulation (fm), amplitude modulation (am), frequency shift keying (fsk), phase shift keyed, (psk) quadrature amplitude modulation (qam), time division multiplexing (tdma), and code division multiplexing (cdma).

7. The radio of claim 1, wherein each of the at least one processor is laminated to the corresponding at least one pocket.

8. The radio of claim 1, wherein the dielectric layer is laminated to the top surface of the substrate and each of the at least one processor.

9. The radio of claim 1, wherein the dielectric layer is a polymer.

10. The radio of claim 1, wherein the metallization layer includes patterns forming an integrated resistor.

11. The radio of claim 1, wherein the metallization layer includes patterns forming an integrated capacitor.

12. The radio of claim 1, wherein the metallization layer includes patterns forming an integrated inductor.

13. The radio of claim 1, further including at least one passive die, each of the at least one passive die being within a corresponding one of the at least one pocket, the passive die being an integrated inductor.

14. The radio of claim 1, further including at least one passive die, or each of the at least one passive die being within a corresponding one of the at least one pocket, the passive die being an integrated capacitor.

15. The radio of claim 1, further including at least one passive die, or each of the at least one passive die being within a corresponding one of the at least one pocket, the passive die being an integrated resistor.

16. A method of manufacturing a radio having a first set of radio components for processing analog signals in a radio transmission and a second set of radio components for processing digital signals in a radio transmission, the method comprising:

forming at least one pocket within a substrate;

placing at least one processor within the corresponding at least one pocket of the substrate for modulating a radio signal into one of a plurality of waveforms based on a software instruction set, the at least one processor is in electronic communication with the both of the first and second sets of radio components;

forming a dielectric layer for covering a top surface of the substrate and the at least one processor;

forming a plurality of vias in the dielectric layer to expose selected portions of each of the at least one processor; and depositing a metallization layer over the dielectric layer and over the plurality of vias so that the at least one processor can be in electrical communication with both of the first and second sets of radio components.

17. The method of forming the radio of claim 16, wherein the method includes:

placing a second processor in a second pocket within the substrate, for performing voice encryption and decryption, the second processor is in electrical communication with both of the first and second radio components.

18. The method of forming the radio of claim 17, wherein the method includes:

placing a third processor within a third pocket within the substrate, for performing voice compression and decompression, the third processor is in electrical communication with both of the first and second radio components.

19. The method of forming the radio of claim 18, wherein the method includes:

placing a fourth processor within a fourth pocket in the substrate, for determining the type of waveform modulation to be performed by the modulator, the fourth processor in electrical communication with both of the first and second radio components.

20. The method of forming the radio of claim 16, comprising:

laminating the at least one processor to the corresponding at least one pocket.

21. The method of forming the radio of claim 16, comprising:

laminating the dielectric layer to the top surface of the substrate and the at least one processor.

22. The method of forming the radio of claim 16, comprising:

forming, with metallization patterns, an integrated resistor.

23. The method of forming the radio of claim 16, comprising:

forming, with metallization patterns, an integrated capacitor.

24. The method of forming the radio of claim 16, comprising:

forming, with metallization patterns, an integrated inductor.

25. The method of forming the radio of claim 16, comprising:

placing at least a first passive die within a corresponding one of the at least one pocket, the passive die being an integrated inductor.

26. The method of forming the radio of claim 16, comprising:

placing at least a first passive die within a corresponding one of the at least one pocket, the passive die being an integrated capacitor.

27. The method of forming the radio of claim 16, comprising:

placing at least a first passive die being within a corresponding one of the at least one pocket, the passive die being an integrated resistor.

28. A method of manufacturing a radio having a first set of radio components for processing analog signals in a radio transmission and a second set of radio components for processing digital signals in a radio transmission, the method comprising:

covering over an electrically conductive frame with a dielectric layer;

placing at least one processor on the dielectric layer for modulating a radio signal into one of a plurality of waveforms based on a software instruction set, the at least one processor is in electronic communication with the both of the first and second sets of radio components;

encapsulating the top of the at least one processor and the dielectric layer;

forming a plurality of vias in the dielectric layer to expose selected portions of each of the at least one processor; and depositing a metallization layer over the dielectric layer and over the plurality of vias so that the at least one processor can be in electrical communication with both of the first and second sets of radio components.

29. The method of forming the radio of claim 28, wherein the method includes:

placing a second processor in a second pocket within the substrate, for performing voice encryption and decryption, the second processor is in electrical communication with both of the first and second radio components.

30. The method of forming the radio of claim 29, wherein the method includes:

placing a third processor within a third pocket within the substrate, for performing voice compression and decompression, the third processor is in electrical communication with both of the first and second radio components.

31. The method of forming the radio of claim 30, wherein the method includes:

placing a fourth processor within a fourth pocket in the substrate, for determining the type of waveform modulation to be performed by the modulator, the fourth processor in electrical communication with both of the first and second radio components.

32. The method of forming the radio of claim 28, comprising:

laminating the at least one processor to the corresponding at least one pocket.

33. The method of forming the radio of claim 28, comprising:

forming, with metallization patterns, an integrated resistor.

34. The method of forming the radio of claim 28, comprising:

forming, with metallization patterns, an integrated capacitor.

35. The method of forming the radio of claim 28, comprising:

forming, with metallization patterns, an integrated inductor.

36. The method of forming the radio of claim 28, comprising:

placing at least a first passive die within a corresponding one of the at least one pocket, the passive die being an integrated inductor.

37. The method of forming the radio of claim 28, comprising:

placing at least a first passive die within a corresponding one of the at least one pocket, the passive die being an integrated capacitor.

38. The method of forming the radio of claim 28, comprising:

placing at least a first passive die being within a corresponding one of the at least one pocket, the passive die being an integrated resistor.

* * * * *